(12) United States Patent
Blanken

(10) Patent No.: US 6,480,058 B2
(45) Date of Patent: Nov. 12, 2002

(54) DIFFERENTIAL PAIR WITH CONTROLLED DEGENERATION

(75) Inventor: Pieter Gerrit Blanken, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/790,418

(22) Filed: Feb. 22, 2001

(65) Prior Publication Data

US 2001/0024132 A1 Sep. 27, 2001

(30) Foreign Application Priority Data

Feb. 24, 2000 (EP) ............................................. 00200636

(51) Int. Cl.$^7$ ................................................ H03F 3/45
(52) U.S. Cl. ........................................ 327/563; 327/67
(58) Field of Search ............................ 327/563, 65, 89, 327/103, 67; 330/252, 253, 254, 258, 261

(56) References Cited

U.S. PATENT DOCUMENTS

| | | | | |
|---|---|---|---|---|
| 3,641,450 A | * | 2/1972 | Lunn | 330/254 |
| 4,388,539 A | | 6/1983 | Boeke | 327/538 |
| 5,642,078 A | | 6/1997 | Navabi et al. | 330/25 |
| 5,661,432 A | * | 8/1997 | Chang et al. | 327/552 |
| 5,726,604 A | * | 3/1998 | Onetti et al. | 330/283 |
| 5,880,631 A | * | 3/1999 | Sahota | 330/254 |
| 5,994,926 A | * | 11/1999 | Siniscalchi et al. | 327/65 |
| 6,271,688 B1 | * | 8/2001 | Marchese et al. | 327/65 |

* cited by examiner

Primary Examiner—Timothy P. Callahan
Assistant Examiner—Terry L. Englund
(74) Attorney, Agent, or Firm—Aaron Waxler

(57) ABSTRACT

An electronic circuit includes a differential pair ($T_1$, $T_2$) provided with a degeneration device (DGMNS) for degenerating a transconductance of the differential pair ($T_1$, $T_2$), and an auxiliary circuit (B) for supplying a control voltage (U) to a control terminal (CNTRL) of the degeneration device (DGMNS). The auxiliary circuit (B) also accomplishes a DC-biasing of the differential pair ($T_1$, $T_2$). The control voltage (U) and the DC-biasing are such that the transconductance of the differential pair ($T_1$, $T_2$) is virtually independent of the value of the control voltage (U) and virtually independent of the DC-biasing of the differential pair ($T_1$, $T_2$). The auxiliary circuit (B) comprises a further differential pair ($T_3$, $T_4$) provided with a further degeneration device (FDGMNS) for degenerating a transconductance of the further differential pair ($T_3$, $T_4$). The auxiliary circuit (B) is arranged for supplying a further control voltage ($U_F$) to a control terminal (FCNTRL) of the further degeneration device (FDGMNS). The control voltage (U) is dependent on the further control voltage ($U_F$). The further control voltage ($U_F$) and the control voltage (U) can, for instance, be the same voltage. The auxiliary circuit (B) includes a device ($B_2$) for generating a desired current ratio (n) between a first branch ($Br_1$) and a second branch ($Br_2$) of the further differential pair ($T_3$, $T_4$). The auxiliary circuit (B) includes a device ($B_1$) for generating a first DC-voltage ($V_P$) to a first input terminal of the further differential pair ($T_3$, $T_4$), and a second DC-voltage ($V_M$) to a second input terminal of the further differential pair ($T_3$, $T_4$).

10 Claims, 6 Drawing Sheets

DIFFERENTIAL PAIR WITH CONTROLLED DEGENERATION

The invention relates to an electronic circuit comprising a differential pair which is provided with degeneration means for degenerating a transconductance of the differential pair, and an auxiliary circuit for providing a control voltage to a control electrode of the degeneration means.

Figure 1:
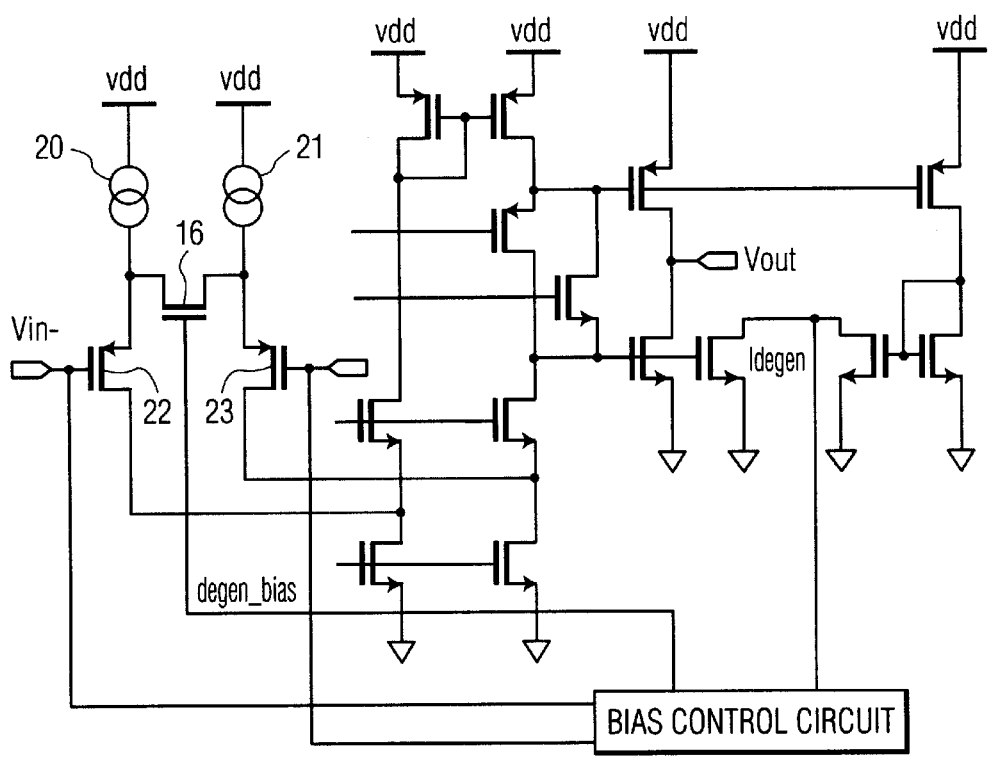

Such an electronic circuit is known from U.S. Pat. No. 5,642,078. The known circuit is shown in FIG. 1 and comprises inter alia a differential pair consisting of a field effect transistor 22 and a field effect transistor 23. The differential pair further comprises a field effect transistor 16 which is connected by a source to the source of the field effect transistor 23 and which is connected by a drain to the source of the field effect transistor 22. The gate of the field effect transistor 16 is connected to a bias control circuit. The required direct currents for the differential pair are supplied by a current source 20 and a current source 21. The field effect transistor 16 is set for its linear operation range and serves to degenerate the transconductance of the differential pair.

It is a disadvantage of the known electronic circuit that the transconductance of the differential pair is not accurately defined.

It is an object of the invention to provide an electronic circuit comprising a differential pair whose transconductance is accurately defined.

According to the invention, the electronic circuit mentioned in the opening paragraph is for this purpose characterized in that the auxiliary circuit is designed for providing a DC biasing of the differential pair, and in that the auxiliary circuit is designed such that the transconductance of the differential pair is substantially independent of the value of the control voltage and of the DC biasing of the differential pair.

Since not only the control voltage at the control electrode of the degeneration means is regulated, as in the known circuit, but also the DC currents of the differential pair are regulated, it can be achieved that the transconductance of the differential pair becomes equal to a desired reference value. The reference value may be obtained, for example, through the use of a reference resistance. The reference resistance may be obtained in various alternative ways, for example through the use of a ratio of resistance values, a capacitor, a ratio of capacitance values, a voltage source, a ratio of voltage values, a current source, a ratio of current values, etc.

An embodiment of an electronic circuit according to the invention is characterized in that the auxiliary circuit comprises a further differential pair comprising further degeneration means for degenerating a transconductance of said further differential pair, and in that the auxiliary circuit is furthermore designed for providing a further control voltage to a control electrode of the further degeneration means, and in that the control voltage is dependent on said further control voltage.

An electronic circuit according to the invention is implemented thereby in a simple manner. If so desired, the degeneration means and the further degeneration means may be constructed in a similar manner. It is also possible to choose the control voltage to be equal to the further control voltage.

An embodiment of an electronic circuit according to the invention is characterized in that the auxiliary circuit comprises current bias means for providing a desired current ratio between a first current branch and a second current branch of the further differential pair.

This renders it simpler to obtain a correct DC biasing of the differential pair.

An embodiment of an electronic circuit according to the invention is characterized in that the current bias means are provided with a first input which is coupled to the first current branch, a second input which is coupled to the second current branch, and an output which is coupled to the control electrode of the further degeneration means.

The current bias means control the control electrode of the further degeneration means such that the ratio of the respective currents of the first and the second current branch is equal to the desired current ratio.

An embodiment of an electronic circuit according to the invention is characterized in that the auxiliary circuit furthermore comprises voltage bias means for providing a first bias voltage to a first input of the further differential pair and a second bias voltage to a second input of the further differential pair, and in that the further differential pair further comprises first current supply means connected in series with the first current branch and second current supply means connected in series with the second current branch, and in that the currents supplied by said first current supply means and second current supply means are dependent on the difference between the first bias voltage and the second bias voltage.

It is achieved thereby that not only the desired current ratio of the first and the second current branch is equal to the desired current ratio, but that also the absolute values of the currents through the first and the second current branch are defined.

An embodiment of an electronic circuit according to the invention is characterized in that said currents are approximately linearly dependent on the difference between the first bias voltage and the second bias voltage.

This renders it possible to generate said currents in a simple manner.

An embodiment of an electronic circuit according to the invention is characterized in that the degeneration means comprise a field effect transistor which is set for its linear operation range, and in that the further degeneration means comprise a further field effect transistor which is set for its linear operation range.

A further linearizing of the differential pair is realized thereby, so that the distortion of the differential pair is reduced.

An embodiment of an electronic circuit according to the invention is characterized in that the value of the first bias voltage corresponds to the highest value of the first bias voltage at which the electronic circuit can still function correctly, and in that the value of the second bias voltage corresponds to the lowest value of the second bias voltage at which the electronic circuit can still function correctly.

This has the advantage that the differential pair continues to function correctly also at the widest possible signal control range at the inputs of the differential pair.

A further advantageous embodiment of an electronic circuit according to the invention is defined in claim 10.

Figure 2:
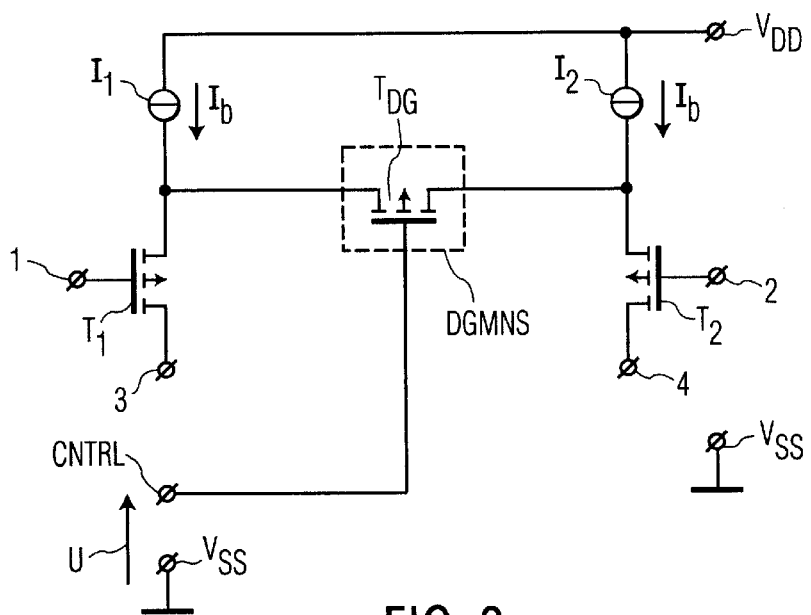
Figure 3:
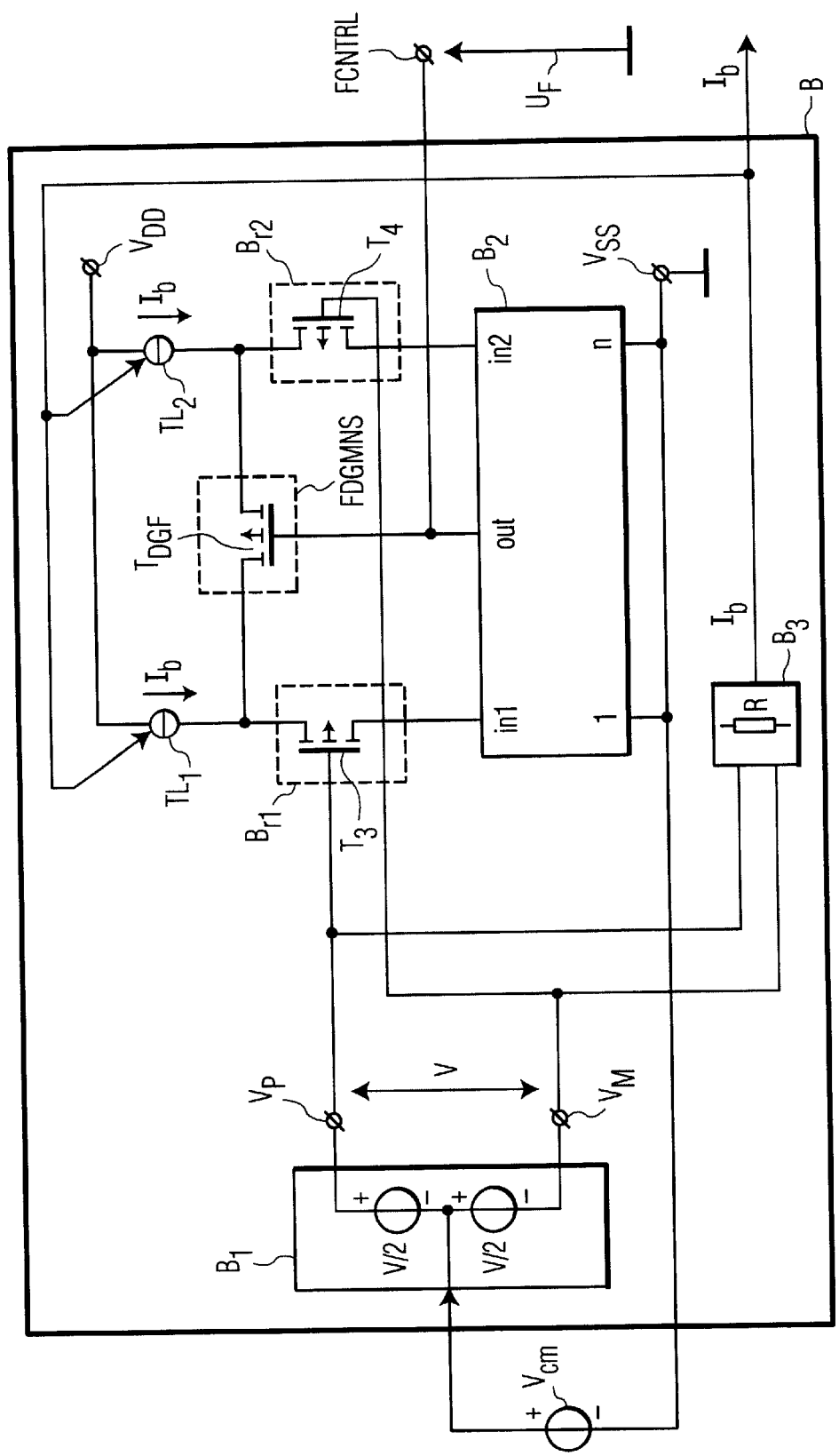
Figure 4:
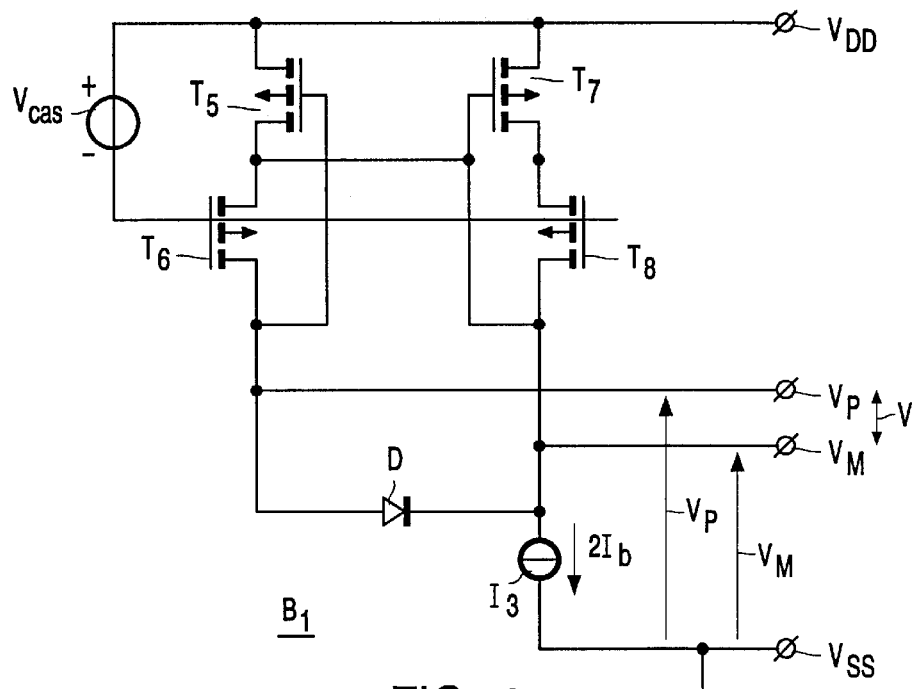
Figure 5:
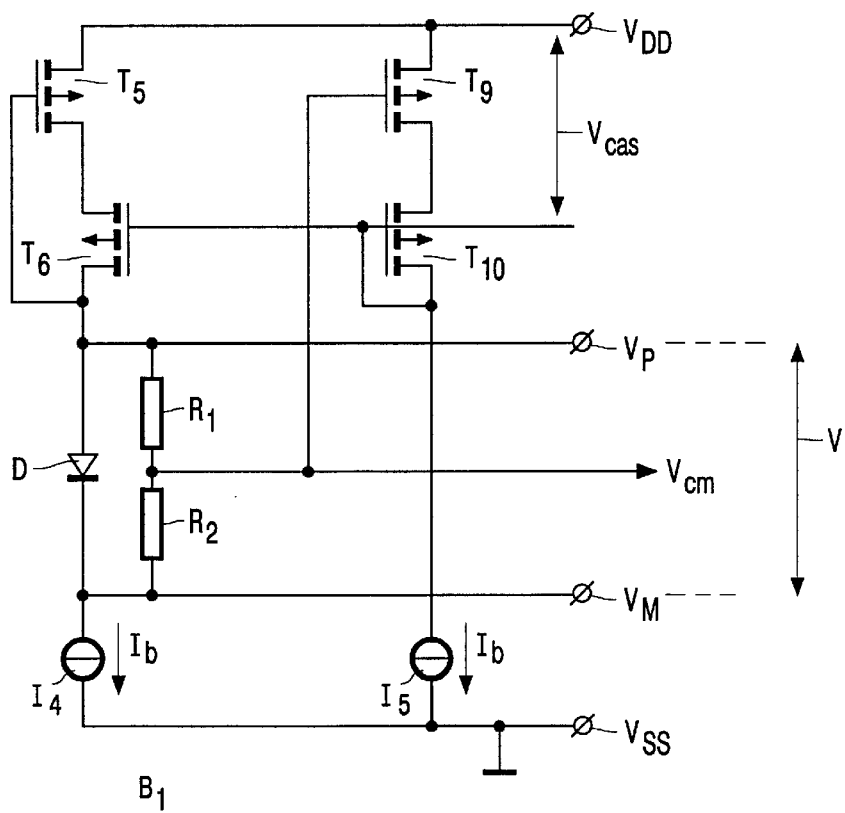
Figure 6:
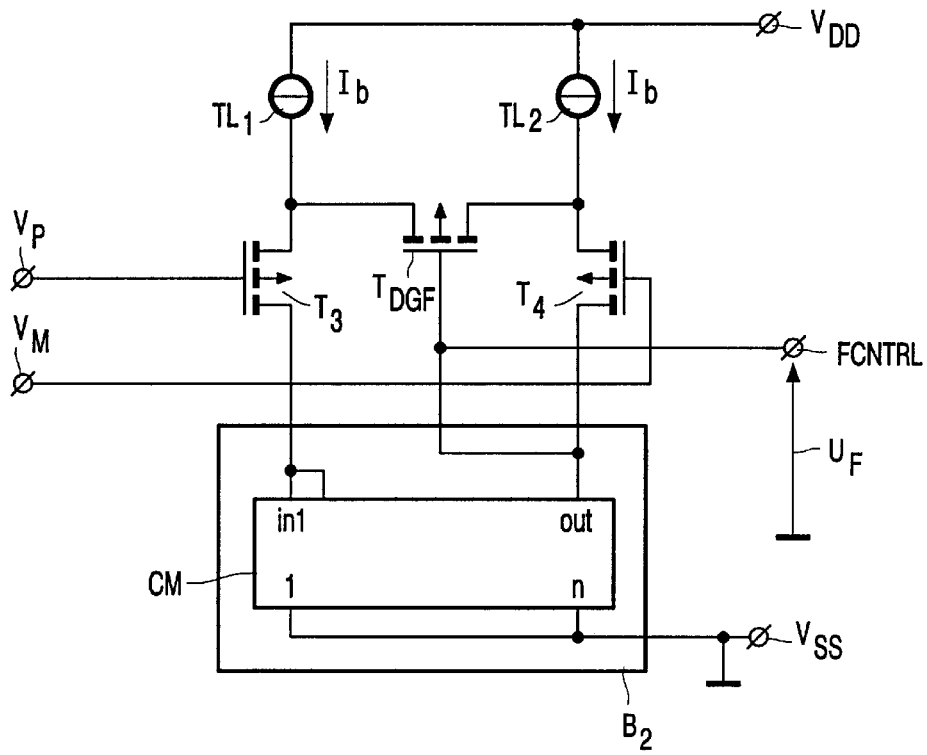
Figure 7:
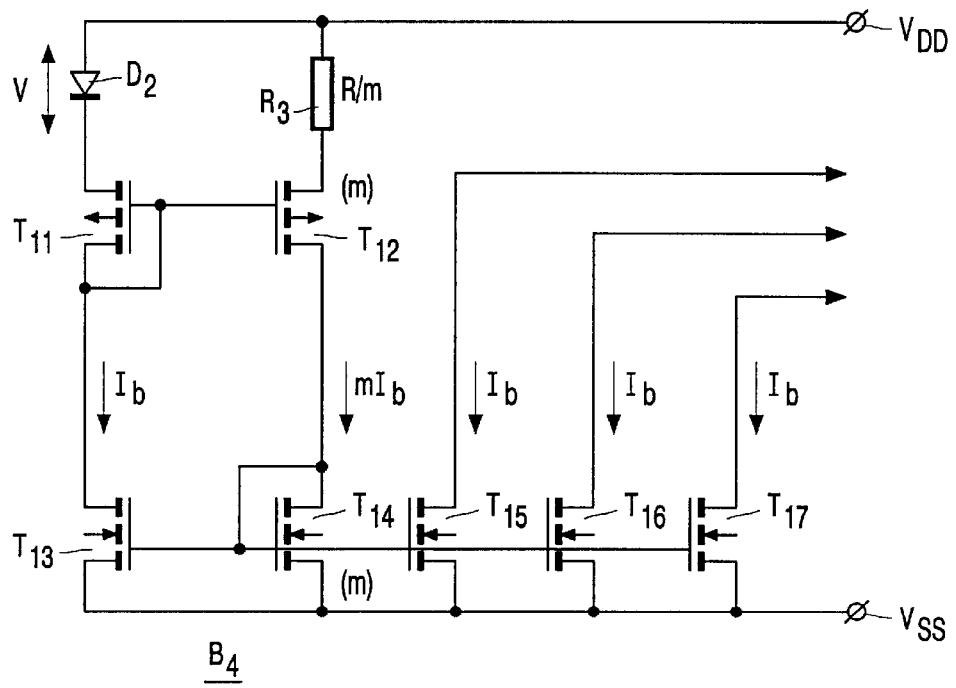
Figure 8:
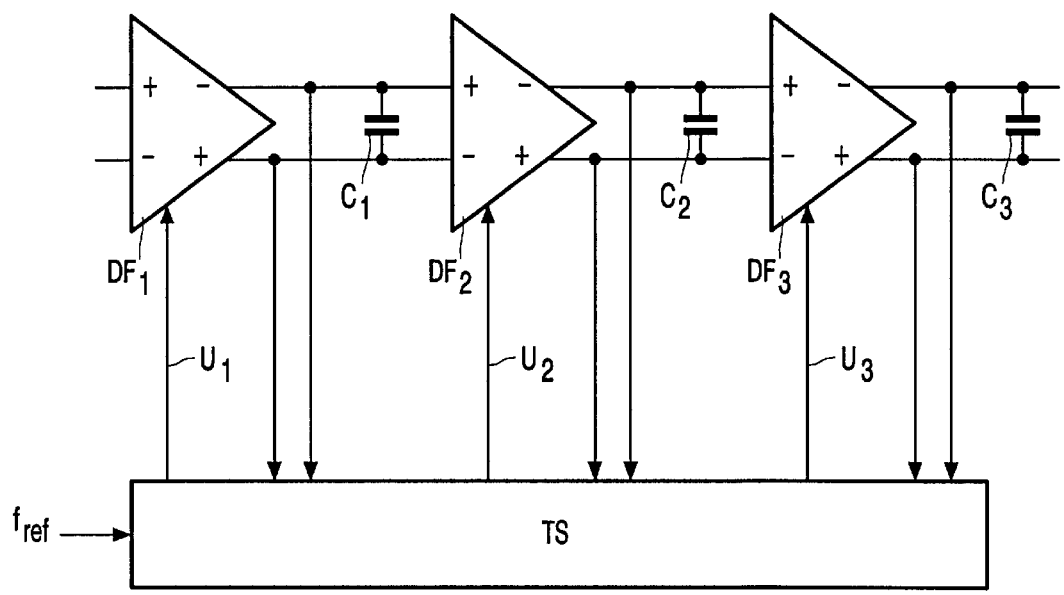
Figure 9:
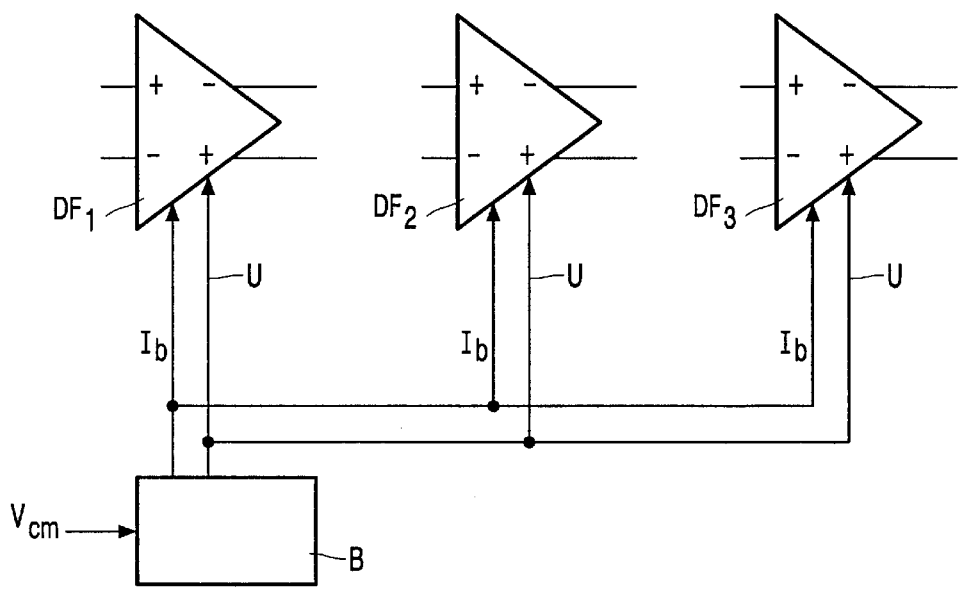
Figure 10:
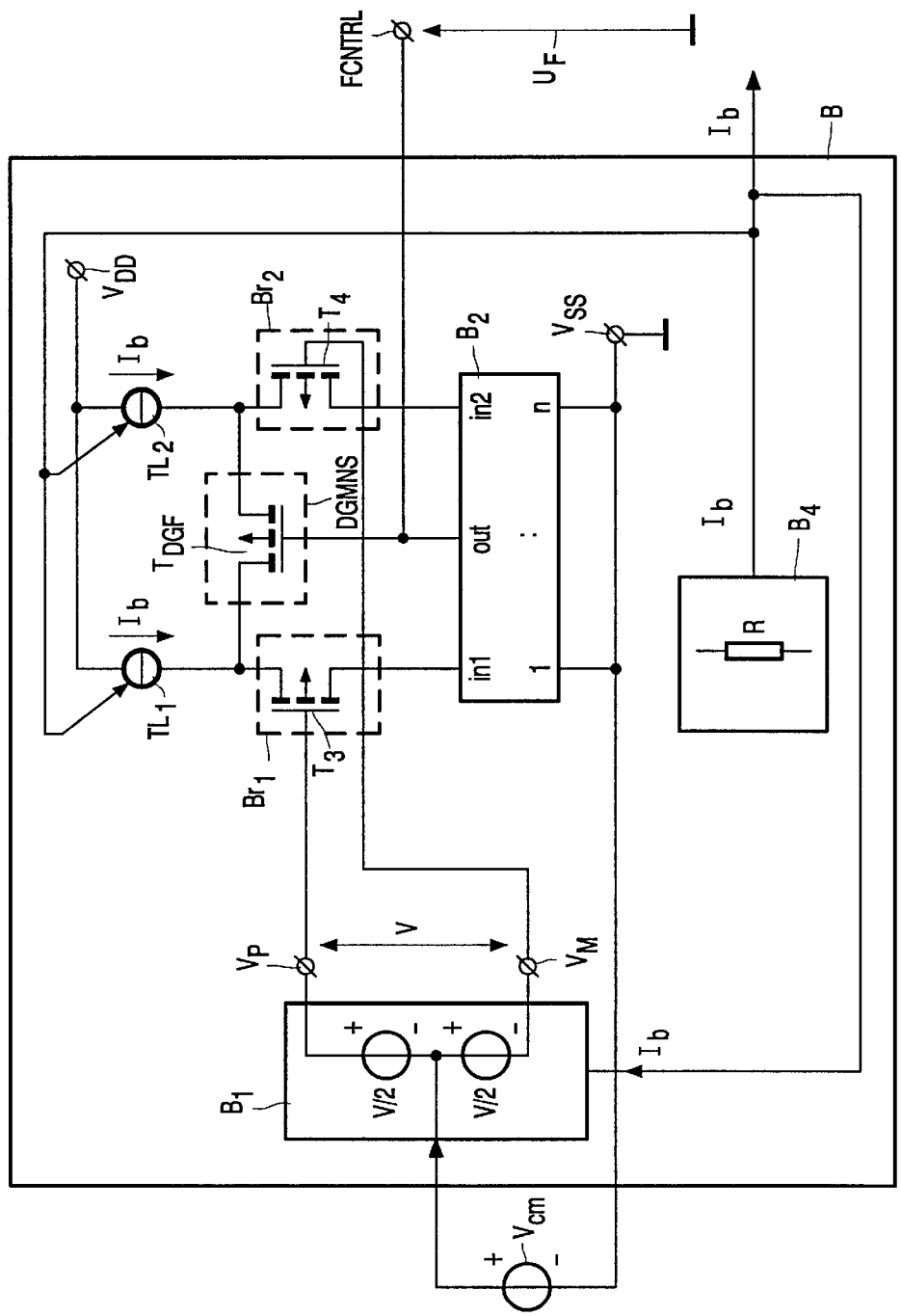

The invention will be explained in more detail below with reference to the accompanying drawing, in which:

FIG. 1 shows a known electronic circuit with a differential pair and a field effect transistor for degenerating the transconductance of the differential pair, FIG. 2 is a circuit diagram of a differential pair which is known per se and which is provided with a field effect transistor for degenerating the transconductance of the differential pair, and which can serve as a basic circuit for realizing a differential pair according to the invention, FIG. 3 is a circuit diagram of an auxiliary circuit designed for providing a DC biasing of a differential pair, FIG. 4 is a circuit diagram of voltage bias means for providing a first and a second bias voltage to the inputs of the differential pair of the auxiliary circuit, FIG. 5 shows an alternative circuit diagram of voltage bias means which supplies not only the first and the second bias voltage but also a common-mode voltage and a cascode voltage for the auxiliary circuit, FIG. 6 shows a circuit diagram of an embodiment of the further differential pair, FIG. 7 shows a circuit diagram of a current-generating circuit for supplying the current $I_b$, FIG. 8 shows a circuit diagram of a so-called $g_m/C$ filter known from the state of the art, FIG. 9 shows an electronic circuit comprising several differential pairs which are all controlled by an auxiliary circuit according to the invention, and FIG. 10 shows a circuit diagram which is an alternative to the auxiliary circuit of FIG. 3.

The same components or elements have been given the same reference symbols in these Figures.

FIG. 2 shows an embodiment of a differential pair which is known per se. The differential pair comprises a first transistor $T_1$, a second transistor $T_2$, degeneration means DGMNS constructed with a field effect transistor $T_{DG}$, a current source $I_1$, and a current source 12. The field effect transistor $T_{DG}$ is connected with its source and drain between the sources of the transistors $T_1$ and $T_2$. The gate of the field effect transistor $T_{DG}$ is connected to a control electrode CNTRL for receiving a control voltage U between the control electrodes CNTRL and a supply terminal $V_{ss}$. The current source $I_1$ is connected between a further supply terminal $V_{DD}$ and the source of the transistor $T_1$. The current source 12 is connected between the further supply terminal $V_{DD}$ and the source of the transistor $T_2$. The gate of the transistor $T_1$ is connected to a terminal 1 which is a first input of the differential pair. The gate of the transistor $T_2$ is connected to a terminal 2 which is a second input of the differential pair. The drain of the first transistor $T_1$, is connected to a terminal 3 which is a first output of the differential pair. The drain of the transistor $T_2$ is connected to a terminal 4 which is a second output of the differential pair. The values of the currents supplied by the first and the second current source $I_1$ and $I_2$ are referenced $I_b$. The field effect transistor $T_{DG}$ is set for its linear operation range, so that it behaves approximately as a linear resistance whose value can be varied by means of the control voltage U. The control voltage U and the currents $I_b$ are supplied from the auxiliary circuit B according to the invention shown in FIG. 3.

FIG. 3 shows the circuit diagram of the auxiliary circuit B. The auxiliary circuit B comprises a further differential pair which is composed in a similar manner as the differential pair of FIG. 2. Transistors $T_3$ and $T_4$ correspond to the transistors $T_1$, and $T_2$, respectively. A further field effect transistor $T_{DGF}$ corresponds to the field effect transistor $T_{DG}$. Current sources $TL_1$ and $TL_2$ correspond to the current sources I1 and $I_2$, respectively.

The auxiliary circuit B further comprises voltage bias means $B_1$, current bias means $B_2$, and a current-generating circuit $B_3$. A common-mode voltage $V_{cm}$ is supplied to the voltage bias means $B_1$. The voltage bias means $B_1$ supply a first bias voltage $V_p$ to the gate of the transistor $T_3$ and a second bias voltage $V_M$ to the gate of the transistor $T_4$. The difference between the first bias voltage $V_p$ and the second bias voltage $V_M$ is indicated with V. The first bias voltage $V_p$ is equal to the common-mode voltage $V_{cm}$ plus half the differential voltage V. The second bias voltage $V_M$ is equal to the common-mode voltage $V_{cm}$ minus half the differential voltage V. The current-generating circuit $B_3$ is connected so as to receive the differential voltage V and supplies the currents $I_b$ to the further differential pair of the auxiliary circuit B and to the differential pair of FIG. 2. The current bias means $B_2$ are provided with a first input in1 which is connected to the drain of the transistor $T_3$, a second input in2 which is connected to the drain of the transistor $T_4$, and an output which is connected to the gate of the further field effect transistor $T_{DGF}$ and to the further control electrode FCNTRL for supplying a further control voltage $U_F$.

The circuit operates as follows. The value of the currents $I_b$ supplied by the current-generating circuit $B_3$ can be calculated from equation 1:

$$I_b = m \cdot \frac{V}{R} \tag{1}$$

in which: R is the value of a reference resistance, and m is a scaling value.

The current bias means $B_2$ supply the currents through the transistor $T_3$ and the transistor $T_4$ such that they have a ratio of 1:n through modification of the further control voltage $U_F$ at the gate of the further field effect transistor $T_{DGF}$. Since the current ratio of the transistors $T_3$ and $T_4$ is controlled by the current bias means $B_2$, and since the currents supplied by the current sources $TL_1$ and $TL_2$ are also controlled by the current-generating circuit $B_3$, the transconductance $g_m$ of a differential pair controlled by the auxiliary circuit B is defined by equation 2:

$$g_m = \frac{1}{R} \cdot \frac{n-1}{n+1} \cdot m \tag{2}$$

The scaling factor m is preferably independent of the temperature and independent of process parameters. This may be realized in a simple manner through standard IC design techniques. The reference value R may be accurately defined in a simple manner, for example through the use of a discrete resistor. It follows from equation 2 that the transconductance $g_m$ of a differential pair is accurately defined then.

FIG. 4 is a circuit diagram of a first embodiment of the voltage bias means $B_1$. The voltage bias means $B_1$ comprise transistors $T_5$ to $T_8$, a diode D, a current source $I_3$, and a voltage source $V_{cas}$. The sources of the transistors $T_5$ and $T_7$ are connected to the further supply terminal $V_{DD}$. The drains of the transistors $T_5$ and $T_7$ are connected to the sources of the transistors $T_6$ and $T_8$. The drain of the transistor $T_6$ is connected to the gate of the transistor $T_5$, to a terminal $V_p$, and to a first electrode of the diode D. The drain of the transistor $T_8$ is connected to the gate of the transistor $T_7$, to a terminal $V_M$, and to a second electrode of the diode D. The current source 13 is connected between the Terminal $V_M$ and the supply terminal $V_{ss}$. The voltage source $V_{cas}$ is connected between the gate of the transistor $T_6$ and the further supply terminal $V_{DD}$.

The transistors $T_6$ and $T_8$ are connected as a differential pair. Since the gates of the transistors $T_6$ and $T_8$ are interconnected, and the sources of the transistors $T_6$ and $T_8$ are interconnected, the transistors $T_6$ and $T_8$ pass equal currents. The current supplied by the current source 13 has a value $2I_b$, so the currents running through the transistors $T_6$ and $T_8$ are equal to $1I_b$. (Since the gate-source voltages of the transistors $T_5$ and $T_7$ are different, the currents through the transistors $T_5$ and $T_7$ are different, but the sum of the currents through the transistors $T_5$ and $T_7$ is equal to $2I_b$.) So the current flowing through the diode D is equal to $1I_b$. The voltage drop across the diode D is equal to the differential voltage V. Since the gates of the transistors $T_5$ and $T_7$ are coupled to the terminals $V_p$ and $V_M$, respectively, the voltages $V_p$ and $V_M$ are defined. The diode D may be replaced by an alternative element across which a voltage drop can be generated such as, for example, a resistor.

FIG. 5 shows a circuit diagram of a second embodiment of the voltage bias means $B_1$. The circuit comprises transistors $T_5$, $T_6$, $T_9$, and $T_{10}$. The circuit further comprises the diode D, resistors $R_1$ and $R_2$, and current sources $I_4$ and $I_5$. The sources of the transistors $T_5$ and $T_9$ are connected to the further supply terminal $V_{DD}$. The sources of the transistors $T_6$ and $T_{10}$ are connected to the drain of the transistor $T_5$ and the drain of the transistor $T_9$, respectively. The gates of the transistors $T_6$ and $T_{10}$ and the drain of the transistor $T_{10}$ are interconnected. The gate of the transistor $T_5$ is connected to the drain of the transistor $T_6$, to the terminal $V_p$, to the first electrode of the diode D, and to a first electrode of the resistor $R_1$. The second electrode of the resistor $R_1$ is connected to a first electrode of the resistor $R_2$ and to the gate of the transistor $T_9$. The second electrode of the diode D is connected to a second electrode of the resistor $R_2$ and to the terminal $V_M$. The current source $I_4$ is connected between the terminal $V_M$ and the supply terminal $V_{ss}$. The current source $I_5$ is connected between the drain of the transistor $T_{10}$ and the supply terminal $V_{ss}$. The voltage source $V_{cas}$ required in FIG. 4 is not necessary in the circuit of FIG. 5 because the voltage $V_{cas}$ is generated by the circuit itself. A further advantage of the circuit of FIG. 5 is that it supplies the required common-mode voltage $V_{cm}$ (see FIG. 3). Again, the diode D may be replaced by an alternative element in this circuit. It is also possible, however, to leave out the diode D and not replace it with another element. The function of the diode D is taken over in that case by the series arrangement of the resistors $R_1$ and $R_2$.

It should be noted that it may be necessary in the case of a differential pair as shown, for example, in FIG. 2, that there is a common mode voltage control at the inputs thereof. The manner in which this is realized is generally known. A circuit may be used for this, for example, such as the arrangement of transistors $T_5$, $T_6$, $T_7$, $T_8$ and the voltage source $V_{cas}$ as shown in FIG. 4. To define the transconductance $g_m$ of a differential pair as accurately as possible (so that no significant deviation arises from the calculated transconductance in accordance with equation 2), it is advisable to choose the DC voltages at terminals 1 and 2 (see FIG. 2) to be equal as much as possible to the DC voltages of the first bias voltage $V_p$ and the second bias voltage $V_M$, respectively (see FIG. 3).

FIG. 6 shows the circuit diagram of an embodiment of the further differential pair. The difference with the further differential pair as shown in FIG. 3 is that the current bias means $B_2$ are constructed with a current mirror CM. The input in1 of the current mirror CM is connected to the drain of the transistor $T_3$. The output out of the current mirror CM is connected to the drain of the transistor $T_4$ and to the gate of the further field effect transistor $T_{DGF}$. The further differential pair may alternatively be constructed with other types of differential pairs, for example cascoded differential pairs. The current mirror CM may simply be composed from two transistors in accordance with the state of the art. More complicated types of current mirrors may also be used, for example cascoded current mirrors.

FIG. 7 is a circuit diagram of an embodiment of a current-generating circuit $B_4$ for supplying the currents $I_b$. The circuit comprises transistors $T_{11}$ to $T_{17}$, a resistor $R_3$, and a diode $D_2$. The sources of the transistors $T_{13}$ to $T_{17}$ are connected to the supply terminal $V_{ss}$. The gates of the transistors $T_{13}$ to $T_{17}$ are interconnected. The drain of the transistor $T_{14}$ is connected to the gate of the transistor $T_{14}$ and to the drain of the transistor $T_{12}$. The resistor $R_3$ is connected between the source of the transistor $T_{12}$ and the further supply terminal $V_{DD}$. The drain of the transistor $T_{13}$, the drain of the transistor $T_{11}$, and the gates of the transistors $T_{11}$ and $T_{12}$ are interconnected. The diode $D_2$ is connected between the source of the transistor $T_{11}$ and the further supply terminal $V_{DD}$. The drains of the transistors $T_{15}$ to $T_{17}$ supply the desired currents $I_b$. It should be noted that the current-generating circuit $B_4$ may be provided with a start circuit in accordance with the state of the art for preventing starting problems.

The current-generating circuit $B_4$ of FIG. 7 will now be explained in more detail in combination with FIG. 10. In FIG. 10, the current-generating circuit $B_3$ of FIG. 3 is replaced by a current-generating circuit $B_4$. The differential voltage V between the terminals $V_p$ and $V_M$ is not supplied to the current-generating circuit $B_4$ in the auxiliary circuit of FIG. 10. A further difference with FIG. 3 is that a current $I_b$ is supplied to the voltage bias means $B_1$. So the current $2I_b$ supplied by the current source $I_3$ in FIG. 4 is supplied from the current-generating circuit $B_4$ or, if the voltage bias means $B_1$ are constructed in accordance with FIG. 5, the currents $I_b$ supplied by the current sources $I_4$ and $I_5$ are supplied from the current-generating circuit $B_4$ here. Now if the diode $D_2$ of FIG. 7 is constructed so as to be identical to the diode D of FIG. 4 or FIG. 5, the voltage V across the diode $D_2$ will be substantially equal to the differential voltage V of FIG. 3 or FIG. 10. The voltage V across the diode $D_2$ of FIG. 7 accordingly is not directly a result of the voltage V of FIG. 3 or FIG. 10, but is generated by the current-generating circuit $B_4$. This renders it possible for an electrode of the diode $D_2$ to be at a fixed potential. In the present case, the anode of the diode $D_2$ is connected to the further supply terminal $V_{DD}$. This renders it easier to realize the current-generating circuit $B_4$ as compared with the current-generating circuit $B_3$. FIG. 7 shows that three currents $I_b$ are supplied from the drains of the transistors $T_{15}$ to $T_{17}$. This is merely an example, the desired number of currents $I_b$ may be adapted in a simple manner. Suppose, for example, that the auxiliary circuit B of FIG. 10 is used, and that three differential pairs as shown in FIG. 2 are controlled by means of the further control signal $U_F$, and that the circuit of FIG. 5 is used for the voltage bias means $B_1$. Each differential pair requires two currents $I_b$. The further differential pair also requires two currents $I_b$. The voltage bias means $B_1$ also require two currents $I_b$. The number of currents $I_b$ to be supplied by the current-generating circuit $B_4$ in this example is equal to 10. It should be noted that the currents $I_b$ (in this example) cannot be derived directly from the current-generating circuit $B_4$ for the differential pairs and the further differential pair. This is because these currents are to be reversed in direction first, for example by means of a current mirror.

FIG. 8 is a circuit diagram of a $g_m/C$ filter which is known per se. In this example, the $g_m/C$ filter comprises three differential pairs $DF_1$, $DF_2$, and $DF_3$, which may be constructed, for example, as shown in the circuit diagram of FIG. 2. The outputs of the differential pairs $DF_1$ to $DF_3$ are coupled to respective capacitors $C_1$ to $C_3$. The $g_m/C$ filter further comprises a building block TS. The building block TS supplies control signals $U_1$ to $U_3$ to the gates of the degeneration field effect transistors of the differential pairs $DF_1$ to $DF_3$. Such $g_m/C$ filters are used, for example, in so-called sigma-delta AD converters.

A disadvantage of known $g_m/C$ filters is that the transconductance of the differential pairs $DF_1$ to $DF_3$ is not accurately defined. This may lead to a wide spread in the zero points with the use in a sigma-delta AD converter.

This disadvantage is eliminated in that the differential pairs $DF_1$, to $DF_3$ are controlled by the auxiliary circuit B according to the invention as shown in FIG. 9. The gates of all degeneration field effect transistors are controlled here with the same control voltage U. Moreover, each differential pair $DF_1$, to $DF_3$ receives the same current $I_b$. Starting from the assumption that the differential pairs $DF_1$, to $DF_3$ are of the same construction, the transconductance values of said differential pairs will be the same. If it should be desirable to obtain twice the transconductance for the differential pair $DF_2$ only, for example, a simple solution is to connect two differential pairs in parallel. The circuit of FIG. 9 may be used, for example, for realizing an improved $g_m/C$ filter. The differential pairs $DF_1$, to $DF_3$ are coupled to one another in the same manner as in FIG. 8, and capacitors $C_1$ to $C_3$ are also added in the same manner.

The electronic circuit may be implemented both with discrete components and in the form of an integrated circuit. Except for the degeneration field effect transistors, the other field effect transistors may be replaced with bipolar transistors. It is also possible to replace all p-conductivity type transistors with n-conductivity type transistors provided all n-conductivity type transistors are replaced with p-conductivity type transistors at the same time.

What is claimed is:

1. An electronic circuit comprising a differential pair ($T_1$, $T_2$) which is provided with degeneration means (DGMNS) for degenerating a transconductance of the differential pair ($T_1$, $T_2$), and an auxiliary circuit (B) for providing a control voltage (U) to a control electrode (CNTRL) of the degeneration means (DGMNS), characterized in that the auxiliary circuit (B) is designed for providing a DC biasing of the differential pair ($T_1$, $T_2$), and in that the auxiliary circuit (B) is designed such that the transconductance of the differential pair ($T_1$, $T_2$) is substantially independent of the value of the control voltage (U) and of the DC biasing of the differential pair ($T_1$, $T_2$).

2. An electronic circuit as claimed in claim 1, characterized in that the auxiliary circuit (B) comprises a further differential pair ($T_3$, $T_4$) comprising further degeneration means (FDGMNS) for degenerating a transconductance of said further differential pair ($T_3$, $T_4$), and in that the auxiliary circuit (B) is furthermore designed for providing a further control voltage ($U_F$) to a control electrode (FCNTRL) of the further degeneration means (FDGMNS), and in that the control voltage (U) is dependent on said further control voltage ($U_F$).

3. An electronic circuit as claimed in claim 2, characterized in that the auxiliary circuit (B) further comprises current bias means ($B_2$) for providing a desired current ratio (n) between a first current branch ($Br_1$) and a second current branch ($Br_2$) of the further differential pair ($T_3$, $T_4$).

4. An electronic circuit as claimed in claim 3, characterized in that the current bias means ($B_2$) are provided with a first input (in1) which is coupled to the first current branch ($Br_1$), a second input (in2) which is coupled to the second current branch ($Br_2$), and an output (out) which is coupled to the control electrode (FCNTRL) of the further degeneration means FDGMNS).

5. An electronic circuit as claimed in claim 4, characterized in that the auxiliary circuit (B) furthermore comprises voltage bias means ($B_1$) for providing a first bias voltage ($V_P$) to a first input of the further differential pair ($T_3$, $T_4$) and a second bias voltage ($V_M$) to a second input of the further differential pair ($T_3$, $T_4$), and in that the further differential pair ($T_3$, $T_4$) further comprises first current supply means ($TL_1$) connected in series with the first current branch ($Br_1$) and second current supply means ($TL_2$) connected in series with the second current branch ($Br_2$), and in that the currents supplied by said first current supply means ($TL_1$) and second current supply means ($TL_2$) are dependent on the difference (V) between the first bias voltage ($V_P$) and the second bias voltage ($V_M$).

6. An electronic circuit as claimed in claim 5, characterized in that said currents are approximately linearly dependent on the difference (V) between the first bias voltage ($V_P$) and the second bias voltage ($V_M$).

7. An electronic circuit as claimed in claims 1, characterized in that the degeneration means (DGMNS) comprise a field effect transistor ($T_{DG}$) which is set for its linear operation range, and in that a further degeneration means (FDGMNS) comprise a further field effect transistor ($T_{DGF}$) which is set for its linear operation range.

8. An electronic circuit as claimed in claim 2, characterized in that the value of the control voltage (U) is approximately equal to the value of the further control voltage ($U_F$).

9. An electronic circuit as claimed in claim 5, characterized in that the value of the first bias voltage ($V_P$) corresponds to the highest value of the first bias voltage ($V_P$) at which the electronic circuit can still function correctly, and in that the value of the second bias voltage ($V_M$) corresponds to the lowest value of the second bias voltage ($V_M$) at which the electronic circuit can still function correctly.

10. An electronic circuit as claimed in claim 3, characterized in that the current bias means ($B_2$) comprise a current mirror (CM) which is provided with an input (in1) coupled to the first current branch ($Br_1$) and an output (out) coupled to the second current branch ($Br_2$), said output (out) being coupled to the control electrode (FCNTRL) of the further degeneration means (FDGMNS).

* * * * *